United States Patent
Prejbeanu et al.

(10) Patent No.: US 8,743,597 B2
(45) Date of Patent: Jun. 3, 2014

(54) SELF-REFERENCED MAGNETIC RANDOM ACCESS MEMORY ELEMENT COMPRISING A SYNTHETIC STORAGE LAYER

(71) Applicant: Crocus Technology SA, Grenoble Cedex (FR)

(72) Inventors: Ioan Lucian Prejbeanu, Seyssinet Pariset (FR); Lucien Lombard, Grenoble (FR); Quentin Stainer, Grenoble (FR); Kenneth Mackay, Le Sappey en Chartreuse (FR)

(73) Assignee: Crocus Technology SA, Grenoble Cedex (FR)

( * ) Notice: Subject to any disclaimer, the term of this patent is extended or adjusted under 35 U.S.C. 154(b) by 0 days.

(21) Appl. No.: 13/711,820

(22) Filed: Dec. 12, 2012

(65) Prior Publication Data

US 2013/0148419 A1  Jun. 13, 2013

(30) Foreign Application Priority Data

Dec. 12, 2011  (EP) ..................................... 11290572

(51) Int. Cl.
| | |
|---|---|
| *G11C 11/16* | (2006.01) |
| *G11C 11/00* | (2006.01) |
| *G11C 11/02* | (2006.01) |
| *G11C 11/15* | (2006.01) |

(52) U.S. Cl.
CPC .......... *G11C 11/161* (2013.01); *G11C 11/1675* (2013.01); *G11C 11/15* (2013.01)
USPC ........................ 365/158; 365/189.16; 365/211

(58) Field of Classification Search
CPC .... G11C 13/0069; G11C 7/00; G11C 11/161; G11C 11/1675; G11C 11/02
USPC ...................................... 365/158, 189.16, 211
See application file for complete search history.

(56) References Cited

U.S. PATENT DOCUMENTS

| | | | |
|---|---|---|---|
| 6,385,082 | B1 | 5/2002 | Abraham et al. |
| 2006/0098498 | A1 | 5/2006 | Jeong et al. |
| 2007/0215967 | A1 | 9/2007 | Wu et al. |
| 2008/0002462 | A1* | 1/2008 | Ruehrig et al. ............... 365/174 |
| 2009/0231909 | A1* | 9/2009 | Dieny et al. ................... 365/158 |
| 2013/0083593 | A1* | 4/2013 | Prejbeanu et al. ............ 365/158 |

FOREIGN PATENT DOCUMENTS

| | | |
|---|---|---|
| EP | 1244117 A2 | 9/2002 |
| WO | 2009074411 A1 | 6/2009 |

OTHER PUBLICATIONS

European search report dated Jul. 23, 2012 for Application EP 11 29 0572.

* cited by examiner

*Primary Examiner* — Ly D Pham
(74) *Attorney, Agent, or Firm* — Pearne & Gordon LLP

(57) ABSTRACT

The present disclosure concerns a MRAM element comprising a magnetic tunnel junction comprising: a storage layer, a sense layer, and a tunnel barrier layer included between the storage layer and the sense layer; the storage layer comprising a first magnetic layer having a first storage magnetization; a second magnetic layer having a second storage magnetization; and a non-magnetic coupling layer separating the first and second magnetic layers such that the first storage magnetization is substantially antiparallel to the second storage magnetization; the first and second magnetic layers being arranged such that: at a read temperature the first storage magnetization is substantially equal to the second storage magnetization; and at a write temperature which is higher than the read temperature the second storage magnetization is larger than the first storage magnetization. The disclosed MRAM element generates a low stray field when the magnetic tunnel junction is cooled at a low temperature.

11 Claims, 7 Drawing Sheets

SELF-REFERENCED MAGNETIC RANDOM ACCESS MEMORY ELEMENT COMPRISING A SYNTHETIC STORAGE LAYER

FIELD

The present disclosure concerns a magnetic random access memory (MRAM) element comprising a magnetic tunnel junction having a synthetic storage layer with a magnetization that can be easily adjusted when the magnetic tunnel junction is heated at a high temperature and generating a low stray field when the magnetic tunnel junction is cooled at a low temperature. The present disclosure also concerns a thermally-assisted method for writing the MRAM element.

DESCRIPTION OF RELATED ART

MRAM cells using the so-called self-referenced reading operation typically comprise a magnetic tunnel junction formed of a magnetic storage layer having a magnetization which direction can be changed from a first stable direction to a second stable direction, a thin insulating layer, and a sense layer having a reversible direction. Self-referenced MRAM cells allows for performing the write and read operation with low power consumption and an increased speed.

However, during the read operation a dipolar coupling between the storage and sense layers occurs due to local magnetic stray field, coupling the magnetization of the sense layer with the one of the storage layer in a closed magnetic flux configuration. Switching the sense layer magnetization during the read operation will then require applying a magnetic field high enough to overcome the dipolar coupling. The dipolar coupling results in a shift (or bias) of the hysteresis loop when applying a field cycle to measure the hysteresis loop of the sense layer. This dipolar coupling depends on the thickness and magnetization of the storage and sense layers, and on the size of the magnetic tunnel junction. In particular, dipolar coupling increases with decreasing the magnetic tunnel junction diameter and can thus become a major issue when scaling down the MRAM cell.

SUMMARY

The present disclosure concerns a random access memory (MRAM) element comprising a magnetic tunnel junction comprising: a storage layer; a sense layer; and a tunnel barrier layer included between the storage layer and the sense layer; the storage layer comprising: a first magnetic layer having a first storage magnetization; a second magnetic layer having a second storage magnetization; and a non-magnetic coupling layer separating the first and second magnetic layers such that the first storage magnetization is substantially antiparallel to the second storage magnetization; the first and second magnetic layers being arranged such that: at a read temperature the first storage magnetization is substantially equal to the second storage magnetization; and at a write temperature which is higher than the read temperature, the second storage magnetization is larger than the first storage magnetization.

In an embodiment, the first magnetic layer can comprise a first ferromagnetic layer having a first Curie temperature, and the second magnetic layer can comprise a second ferromagnetic layer having a second Curie temperature which is higher than the first Curie temperature.

In another embodiment, the write temperature can be comprised below the first and second Curie temperatures.

In yet another embodiment, the write temperature can be comprised above the first Curie temperature and below the second Curie temperature.

In yet another embodiment, the first magnetic storage layer can comprise a ferrimagnetic amorphous alloy comprising a sub-lattice of transition metals atoms providing a 3d storage magnetization, and a sub-lattice of rare-earth atoms providing a 4f storage magnetization being antiparallel to the 3d storage magnetization; the first storage magnetization corresponding to the vectorial sum of the 3d storage magnetization and the 4f storage magnetization.

In yet another embodiment, the rare earth sub-lattice can have a first Curie temperature and the transition metal atom sub-lattice can have a second Curie temperature which is higher than the first Curie temperature.

In yet another embodiment, the write temperature can correspond substantially to a compensation temperature of the ferrimagnetic storage layer, where the first storage magnetization becomes substantially zero.

In yet another embodiment, the write temperature can correspond substantially to the first Curie temperature of the rare earth sub-lattice of the ferrimagnetic storage layer.

The present disclosure also pertains to a method for writing to the MRAM element, comprising:

heating the magnetic tunnel junction to the write temperature;

adjusting the first and second storage magnetizations; and cooling the magnetic tunnel junction to the read temperature.

In an embodiment, adjusting the first and second storage magnetizations can be performed by applying a write magnetic field.

In another embodiment, the MRAM element can further comprise a current line in electrical contact with one end of the magnetic tunnel junction; and heating the magnetic tunnel junction can comprise passing a heating current in the magnetic tunnel junction via the current line.

The first and second storage magnetizations of the disclosed MRAM element can be easily adjusted when the magnetic tunnel junction is heated at a high temperature and generating a low stray field when the magnetic tunnel junction is cooled at a low temperature.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
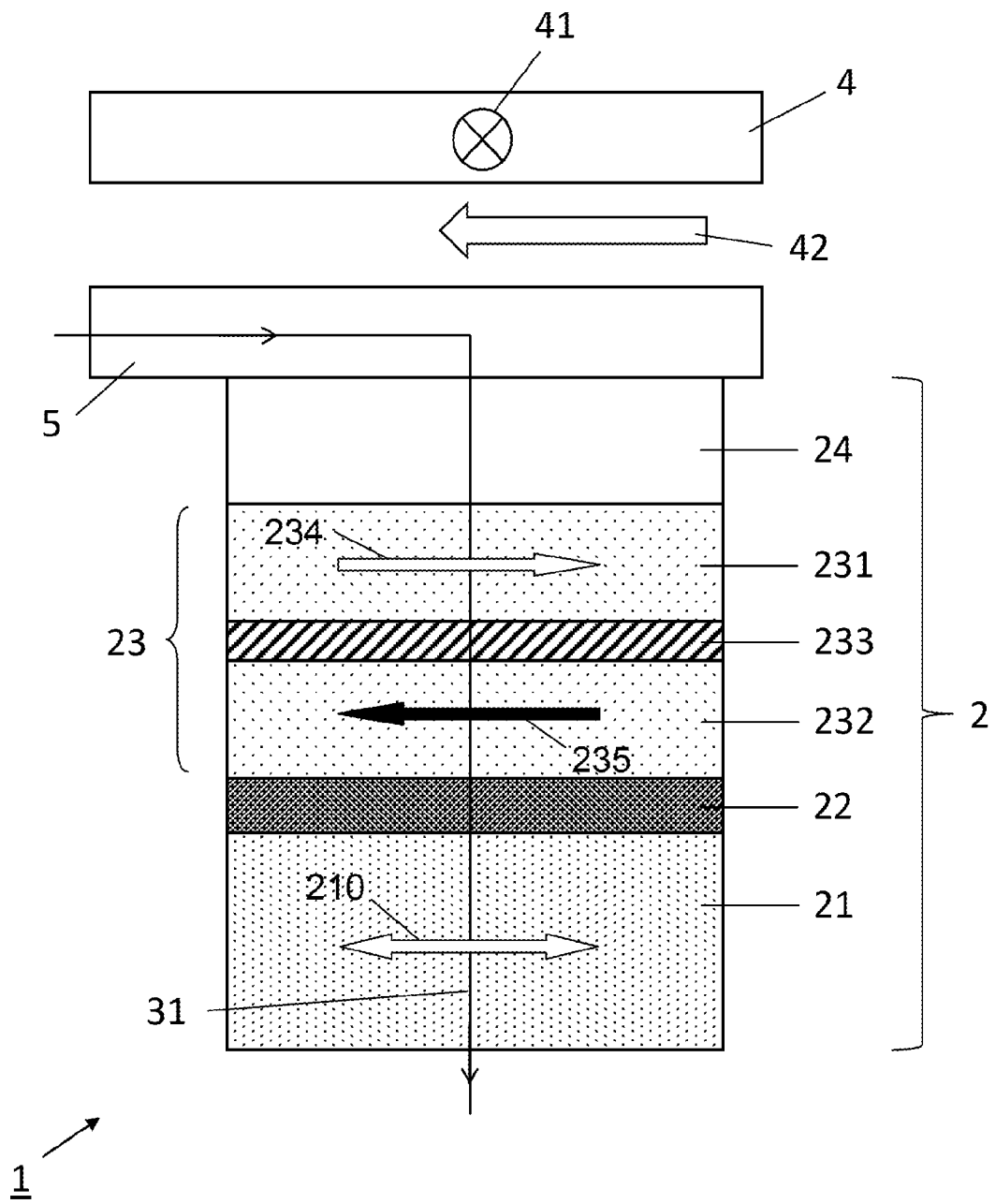
FIG. 1 illustrates a self-referenced random access memory (MRAM) element comprising a magnetic tunnel junction comprising a storage layer having a first storage magnetization and a second storage magnetization, according to an embodiment.

FIG. 1 illustrates a self-referenced random access memory (MRAM) element 1 according to an embodiment. The MRAM cell 1 comprises a magnetic tunnel junction 2 comprising a storage layer 23; a sense layer 21; and a tunnel barrier layer 22 included between the storage layer 23 and the sense layer 21.

In the embodiment of FIG. 1, the storage layer 23 comprises a synthetic antiferromagnet (SAF) structure comprising a first magnetic layer 231 being ferromagnetic and having a first storage magnetization 234, a second magnetic layer 232 being ferromagnetic and having a second storage magnetization 235, and a non-magnetic coupling layer 233 separating the first and second ferromagnetic layers 231, 232. The ferromagnetic layers 231 and 232 may be made of a material such as, for example, cobalt iron (CoFe), cobalt iron bore (CoFeB), nickel iron (NiFe), Cobalt (Co), etc. The thickness of the first and second ferromagnetic layer 231, 232 can be comprised, for example, between 1 nm and 10 nm, but preferably between about 1.5 nm and about 4 nm.

The coupling layer 233 can comprise a material selected from a group consisting of ruthenium (Ru), rhenium (Re), rhodium (Rh), tellurium (Te), yttrium (Y), chromium (Cr), iridium (Ir), silver (Ag), copper (Cu), etc. Preferably, the coupling layer 233 is made of ruthenium. The dimensions (e.g., thickness) of the coupling layer 233 may be selected to cause the first and second ferromagnetic layers 231 and 232 to be magnetically coupled, such that the first storage magnetization 234 is oriented anti-parallel with the second magnetization 235. The thickness may depend on the material that the coupling layer 233 is formed from. The thickness is typically comprised between about 0.2 nm and about 3 nm, preferably between about 0.6 nm and about 2 nm, or about 0.6 nm and about 0.9 nm or between about 1.6 nm and about 2 nm. Other thicknesses may also be suitable to couple the two ferromagnetic layers 231 and 232.

The magnetic tunnel junction 2 further comprises a sense layer 21 having a sense magnetization 211 that is reversible, and a tunnel barrier layer 22 separating the sense layer 21 from the storage layer 23. The sense layer 21 can be made of NiFe-based alloys instead of CoFeB-based alloys in order to obtain a lower switching field. Preferably, the sense layer 21 is not exchange biased and its magnetization has a direction that can be varied freely, for example, due to thermal agitation and thus, its magnetization can be freely aligned in a magnetic field. The tunnel barrier layer 22 is a thin layer, typically in the nanometer range and can be formed, for example, from any suitable insulating material, such as alumina ($Al_2O_3$) or magnesium oxide (MgO).

In an embodiment, the storage layer 23 can be exchange coupled with an antiferromagnetic layer 24, such as represented in the exemplary configuration of FIG. 1. The antiferromagnetic layer 24 is adapted to pin the first storage magnetization 234 of the first ferromagnetic layer 231 below a critical temperature and to free it at or above the critical temperature. The antiferromagnetic layer 24 can be made from a manganese-based alloy, such as IrMn, PtMn or FeMn, or any other suitable materials.

In a preferred embodiment, the first ferromagnetic layer 231 has a first Curie temperature $T_{C1}$ that is inferior to a second Curie temperature $T_{C2}$ of the second ferromagnetic layer 232.

Figure 2:
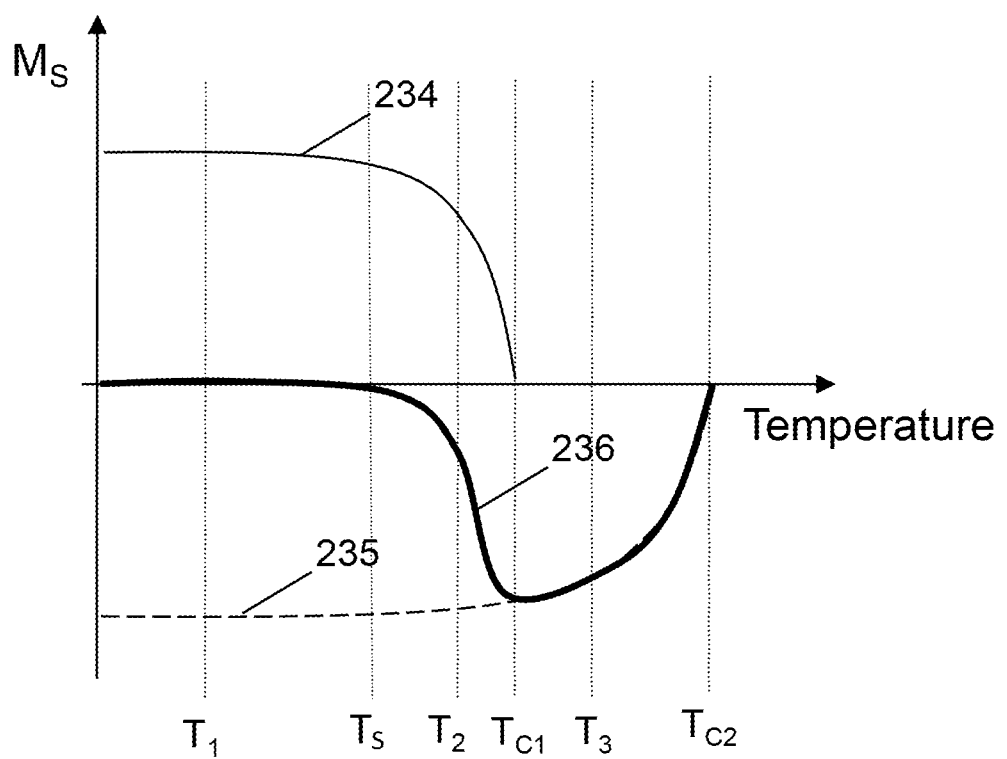
FIG. 2 reports the temperature dependence of a magnetization of the first storage magnetization and of the second storage magnetization.
Figure 3:
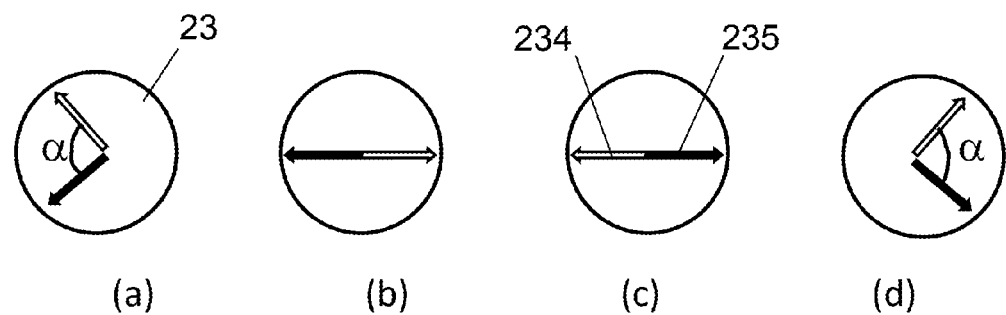
FIGS. 3a to 3d represent a top view of the storage layer illustrating arrangements of the first and second storage magnetization, according to an embodiment.

FIG. 2 reports the temperature dependence of the saturation magnetization Ms of the first storage magnetization 234 and of the second storage magnetization 235, according to an embodiment. The first and second storage magnetization 234, 235 decrease as the temperature is increased towards the Curie temperatures $T_{C1}$ and $T_{C2}$, respectively. At or above the Curie temperatures $T_{C1}$, $T_{C2}$, thermal fluctuations are such that the net magnetization of the first and second storage magnetization 234, 235, respectively, becomes zero and the material is paramagnetic. Also reported in FIG. 2 is the temperature dependence of an effective storage magnetization 236 of the storage layer 23. The effective storage magnetization 236 corresponds to the vectorial sum of the first storage magnetization 234 and the second storage magnetization 235. At a read temperature $T_1$, below a threshold temperature $T_S$ that is well below the first and second Curie temperatures $T_{C1}$, $T_{C2}$, the first and second storage magnetizations 234, 235 are substantially equal and the effective storage magnetization 236 is substantially null. Here, the expressions substantially equal and substantially null include exactly equal and exactly null, respectively. A net storage magnetic stray field (not represented) that would be generated by the effective storage magnetization 236 is thus substantially null and no dipolar coupling occurs between the storage layer 23 and the sense layer 21. Consequently, at the read temperature $T_1$ the sense magnetization 211 can be easily switched, for example using a small external magnetic field. Setting the magnetic tunnel junction 2 at the read temperature $T_1$ is thus advantageous when performing a read operation of the MRAM element 1. The read temperature $T_1$ can correspond to an operation temperature of the MRAM element 1, for example, the temperature of the MRAM cell environment.

Figure 4:
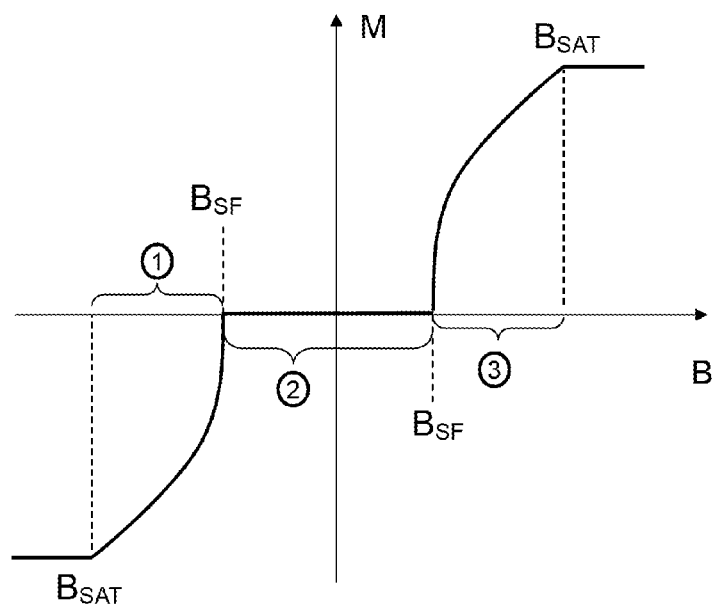
FIG. 4 represents a magnetization curve of the storage according to the embodiment of FIGS. 3a to 3d.

FIGS. 3a to 3d represent a top view of the storage layer 23 illustrating arrangements of the first and second storage magnetization 234, 235 according to an embodiment where the magnetic tunnel junction 2 is at the read temperature $T_1$. FIG. 4 represents a magnetization curve of the SAF storage layer 23 for the case where the magnetic tunnel junction 2 is at the read temperature $T_1$. The symbol B denotes the magnitude of an external write magnetic field 42 and the symbol M denotes magnetization values of the first and second storage magnetization 234, 235. FIG. 4 shows that, when the write magnetic field 42 is applied with a magnitude that is below a spin-flop field value $B_{SF}$ (flat portion denoted by the symbol ② in FIG. 4), no switching of the first and second storage magnetizations 234, 235 occurs. The first and second storage magnetizations 234, 235 are then oriented antiparallel (see FIGS. 3b and 3c) due to the coupling effect of the coupling layer 233. When the magnitude of the write magnetic field 42 is increased above the spin-flop field value $B_{SF}$ (portions denoted by the symbols ① and ③ in FIG. 4), the first storage magnetization 234 is no more antiparallel with the second storage magnetization 235 but forms a predetermined angle α with the second storage magnetization (see FIGS. 3a and 3d). The first storage magnetization 234 can become oriented substantially parallel to the second storage magnetization 235 (not represented in FIG. 3) by further increasing the write magnetic field 42 to a saturation field value $B_{SAT}$.

At the read temperature $T_1$ of the magnetic tunnel junction 2, switching the first and second storage magnetizations 234, 235 thus require applying the write magnetic field 42 with a magnitude above the spin-flop field value $B_{SF}$. Since typical spin-flop field values $B_{SF}$ range between about 400 Oe and 600 Oe, switching the first and second storage magnetizations 234, 235 at the read temperature $T_1$ of the magnetic tunnel junction 2 requires the write magnetic field 42 having a magnitude being at least above 400 Oe.

FIGS. 5a to 5d illustrate arrangements of the first and second storage magnetization 234, 235 in the case where the magnetic tunnel junction 2 is at a write temperature $T_2$, above the threshold temperature ($T_S$) and thus being higher the read temperature $T_1$. In the present example, the write temperature $T_2$ is below the first and second Curie temperatures $T_{C1}$, $T_{C2}$ but in the vicinity of the first Curie temperature $T_{C1}$, such that the second storage magnetizations 235 becomes larger than the first storage magnetizations 234 (see FIG. 2), and the effective storage magnetization 236 is non-null. In FIGS. 5a to 5d, the larger magnitude of the second storage magnetizations 235 is represented by the thicker arrow 235.

Figure 5:
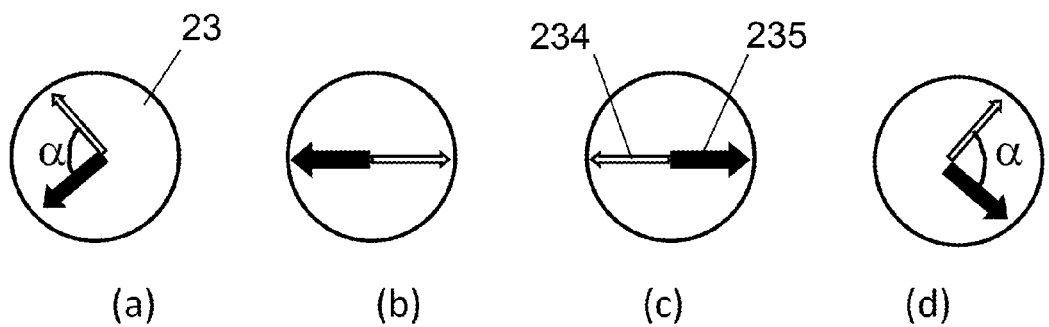
FIGS. 5a to 5d illustrate arrangements of the first and second storage magnetization according to another embodiment.
Figure 6:
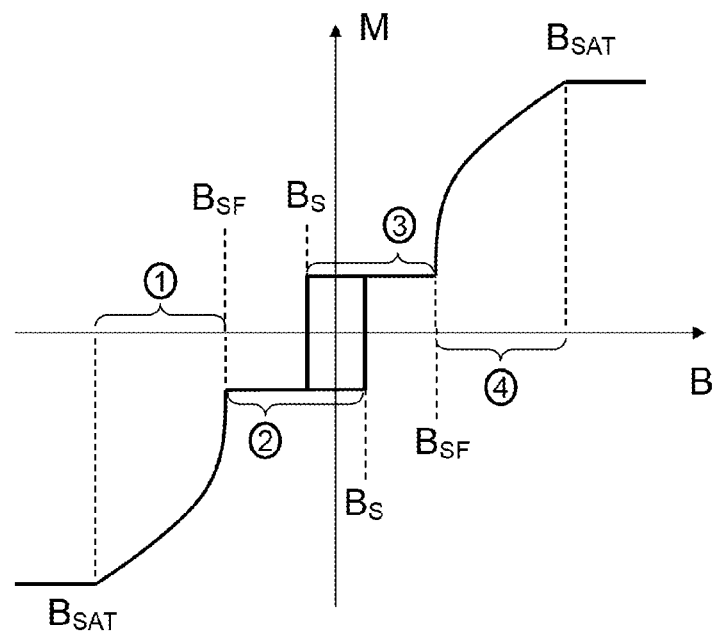
FIG. 6 represents the magnetization curve of the storage layer according to the embodiment of FIGS. 5a to 5d.

FIG. 6 represents a magnetization curve of the SAF storage layer 23 for the case where the write magnetic field 42 is applied with the magnetic tunnel junction 2 being at the write temperature $T_2$. In this case, the magnetization curve shows a hysteresis in the curve portion denoted by the symbols ② and ③ in FIG. 6. The first and second storage magnetizations 234, 235 can then be switched, for example, from a first orientation shown in FIG. 5b to another orientation shown in FIG. 5c when the write magnetic field 42 is applied with a magnitude equal or greater than a switching field value $B_S$. By way of illustration, the switching field $B_S$ can be lower than 80 Oe. In FIGS. 5b and 5c, the first and second storage magnetizations 234, 235 are oriented antiparallel due to the coupling effect of the coupling layer 233. Similarly to the magnetization curve of FIG. 4, portions ① and ④ in FIG. 6 correspond to the write magnetic field 42 being applied with a magnitude equal or above the spin-flop field value $B_{SF}$ yielding arrangements shown in FIGS. 5a and 5d where the first and second storage magnetizations 233, 234 form the predetermined angle α with each other.

Figure 7:
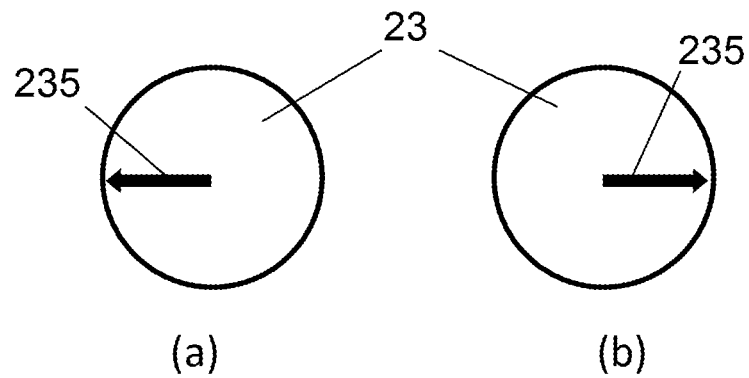
FIGS. 7a and 7b illustrate arrangements of the first and second storage magnetization according to yet another embodiment.

FIGS. 7a and 7b illustrate arrangements of the first and second storage magnetization 234, 235 in the case where the magnetic tunnel junction 2 is at the write temperature $T_3$ that is above the first Curie temperature $T_{C1}$ but below the second Curie temperature $T_{C2}$ (see FIG. 2). Since the magnetic tunnel junction 2 is above the first Curie temperature $T_{C1}$, the first storage magnetization 234 becomes substantially zero. The effective storage magnetization 236 is therefore determined only by the second storage magnetization 235. In FIGS. 7a and 7b, this is represented by displaying only the second storage magnetization 235. In this configuration, the SAF storage layer 23 behaves as if it comprises only the second ferromagnetic layer 232.

Figure 8:
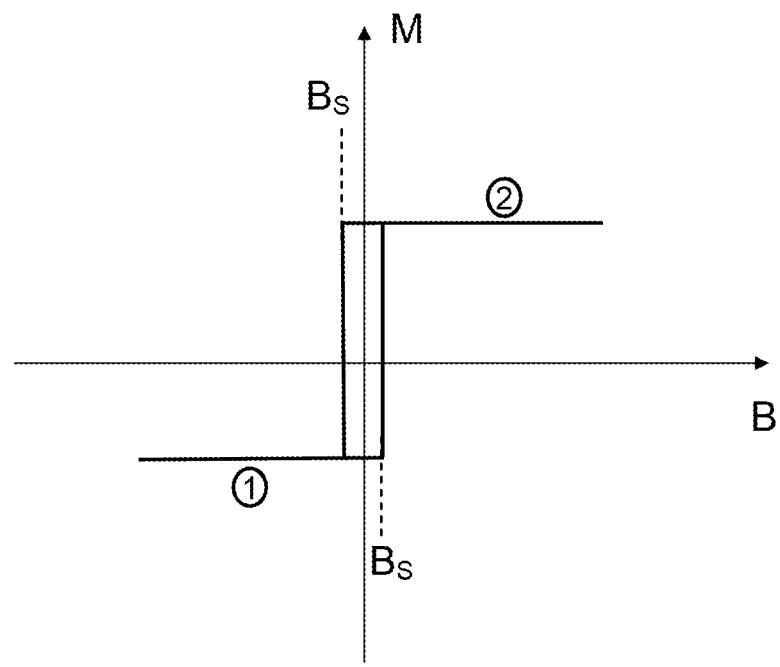
FIG. 8 represents a magnetization curve of the storage layer according to the embodiment of FIGS. 7a and 7b.

FIG. 8 represents a magnetization curve of the SAF storage layer 23 for the case where the write magnetic field 42 is applied with the magnetic tunnel junction 2 being at the write temperature $T_3$. The magnetization curve of FIG. 8 shows a hysteresis in the curve portion denoted by the symbols ① and ②. The second storage magnetization 235 can be switched, for example from a first orientation shown in FIG. 7a to another orientation shown in FIG. 7b when the write magnetic field 42 is applied with a magnitude equal or greater than a switching field value $B_S$. Here, switching field value $B_S$ can be lower than 40 Oe since only the second storage magnetization 235 has to be switched.

According to an embodiment, a thermally-assisted write operation of the MRAM element 1 can comprise:

heating the magnetic tunnel junction 2 to the write temperature $T_2$, $T_3$, $T_4$;

adjusting the first and second storage magnetizations 234, 235; and cooling the magnetic tunnel junction 2 to the read temperature $T_1$.

Adjusting the first and second storage magnetizations 234, 235 can be performed by applying the write magnetic field 42. By way of example only, the write magnetic field 42 can be generated by passing a field current 41 in a field line 4 (see FIG. 1). Alternatively, the write magnetic field 42 can be generated by passing the field current 41 in a current line 5 in electrical contact with one end of the magnetic tunnel junction 2. The magnitude of the write magnetic field 42 is adapted to align the first and second storage magnetizations 234, 235 in accordance with the orientation of the write magnetic field 42, or with the magnitude and polarity of the field current 41. More particularly, in FIG. 1 the field current 41 is shown pointing within the page and the magnetic field 42 is represented by the arrow pointing toward the left. Alternatively, the first and second storage magnetizations 234, 235 can be adjusted by passing a spin polarized current (not shown) in the magnetic tunnel junction 2, for example, via the current line 5.

Heating the magnetic tunnel junction 2 can be performed, for example, by passing a heating current 31 in the magnetic tunnel junction 2 via the current line 5, such as illustrated in FIG. 1. Preferably, the magnetic tunnel junction 2 is heated at the write temperature $T_3$ at which the first storage magnetization 234 becomes substantially zero and where adjusting the first and second storage magnetizations 234, 235 is easiest, for example, requires the lowest write magnetic field 42. In an embodiment, the write temperature $T_3$ corresponds to the effective storage magnetization 236 being substantially maximal. In the example of FIG. 2, the maximum of the effective storage magnetization 236 corresponds to the first Curie temperature $T_{C1}$ where the first storage magnetization 234 becomes zero and the second storage magnetization 235 is below the second Curie temperature $T_{C2}$. At $T_3$, the write magnetic field 42 required for switching the sole second storage magnetization 235 is thus lowest. For example, the switching field value $B_S$ can be lower than 40 Oe.

The magnetic tunnel junction 2 is preferably cooled at the read temperature $T_1$ where the first and second storage magnetizations 234, 235 are substantially equal and the effective storage magnetization 236 is substantially null (see FIG. 2). Thus, at the read temperature $T_1$, essentially no storage magnetic stray field is generated by the storage layer 23 and substantially no dipolar coupling occurs between the storage layer 23 and the sense layer 21. At the read temperature $T_1$ the sense magnetization 211 can be easily switched, for example using a small external magnetic field (below 40 Oe). Setting the magnetic tunnel junction 2 at the read temperature $T_1$ is thus advantageous when performing the read operation of the MRAM element 1.

Second Embodiment

Figure 9:
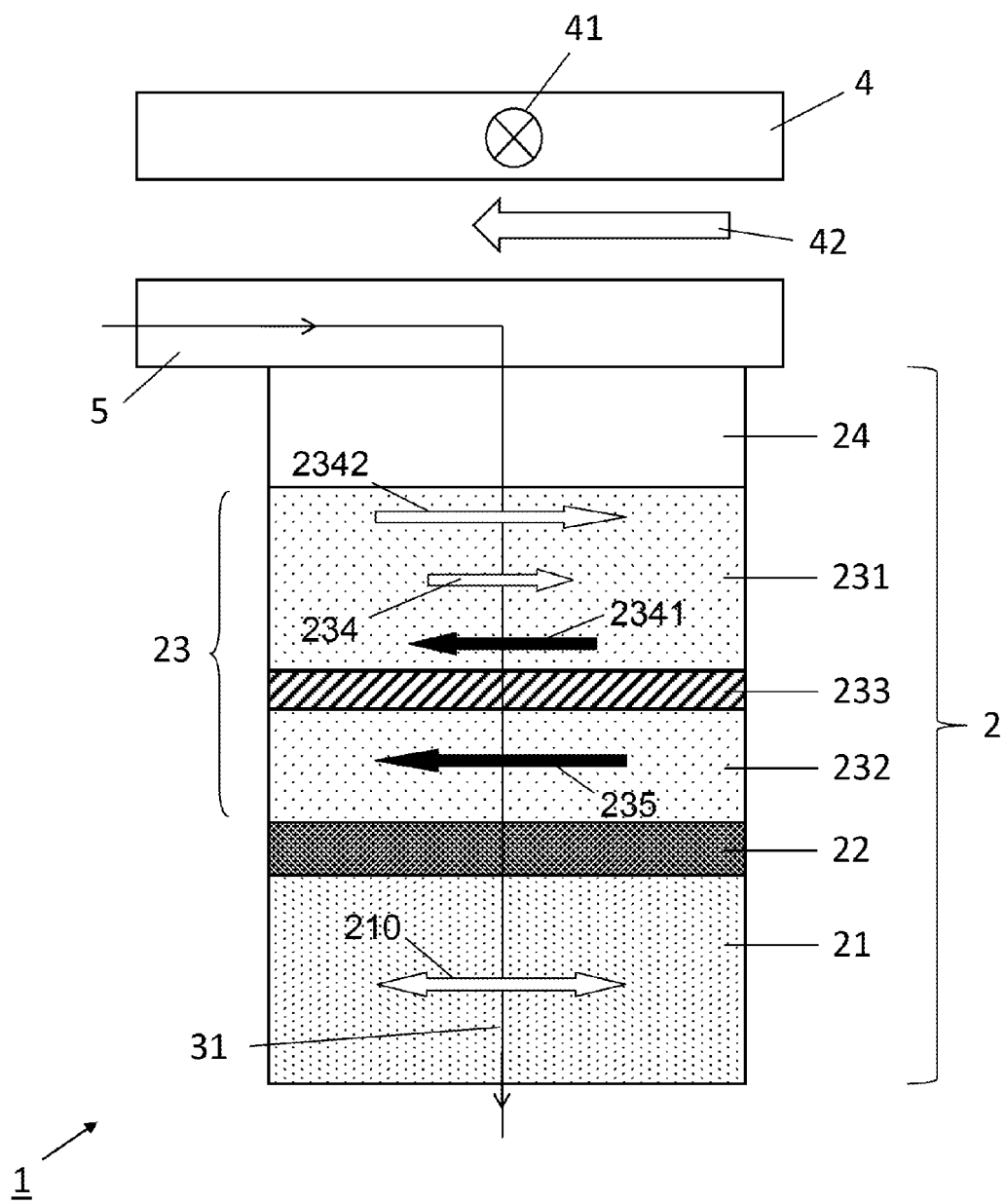
FIG. 9 illustrates the MRAM element, according to another embodiment.

FIG. 9 illustrates the MRAM element 1 according to another embodiment, where the first magnetic layer of the SAF storage layer 23 is ferrimagnetic. Preferably, the ferrimagnetic storage layer 231 comprises a ferrimagnetic amorphous alloy. The ferrimagnetic amorphous alloy can be provided by selecting adequate elements and relative compositions between transition metals and rare-earth materials. More particularly, the ferrimagnetic storage layer 231 comprises a sub-lattice of rare-earth atoms providing a 4f storage magnetization 2342, and a sub-lattice of transition metal atoms providing a 3d storage magnetization 2341 being oriented substantially antiparallel to the 4f storage magnetization. The first storage magnetization 234 of the ferrimagnetic storage layer 231 corresponds to the vectorial sum of the 3d storage magnetization 2341 and the 4f storage magnetization 2342. The thickness of the coupling layer 233 can be selected such that the second storage magnetization 235 is coupled in parallel with the 3d storage magnetization 2341 as represented in the example of FIGS. 9 and 10.

Figure 10:
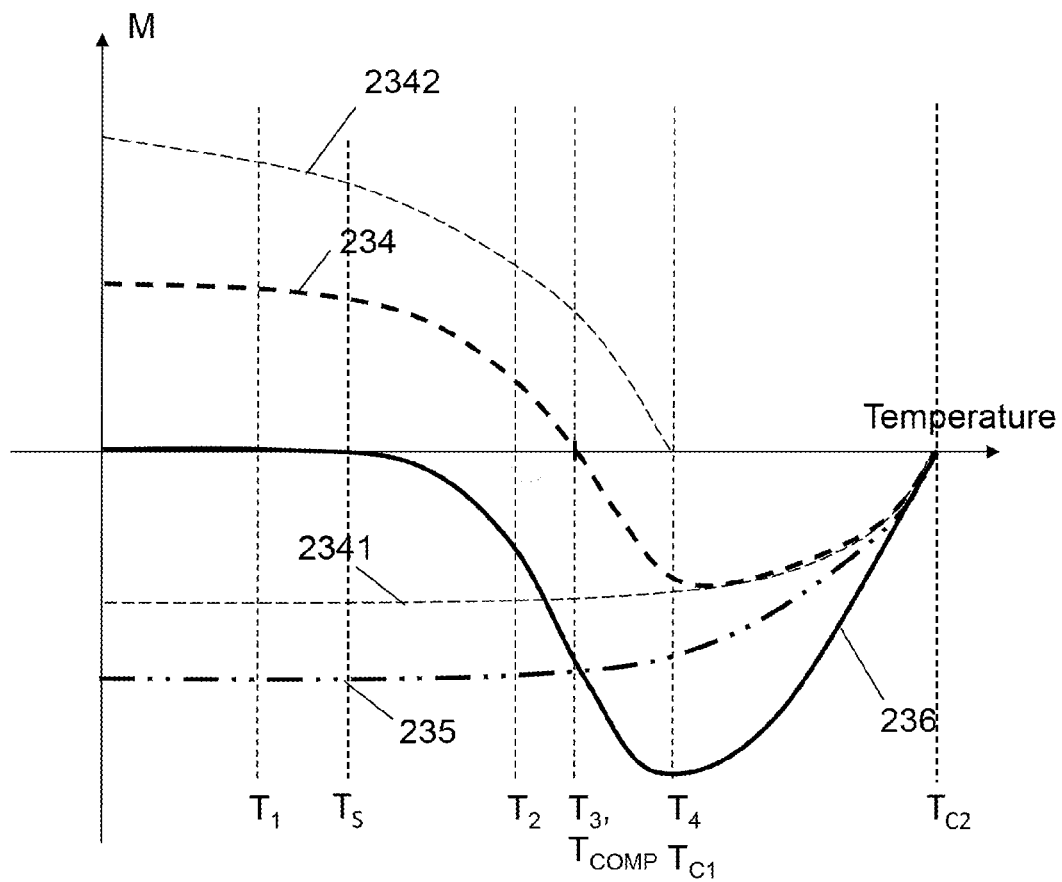
FIG. 10 reports the temperature dependence of a magnetization of the first and second storage magnetization of the MRAM element according to the embodiment of FIG. 9.

FIG. 10 reports the temperature dependence of the 4f and 3d storage magnetizations 2342, 2341 and for the second storage magnetization 235 of the MRAM element 1 according to the embodiment of FIG. 9. Also reported in FIG. 10 is the temperature dependence of the first storage magnetization 234 and of the effective storage magnetization 236 of the storage layer 23. In the example of FIG. 10 the first Curie temperature $T_{C1}$ of the rare-earth sub-lattice of the ferrimagnetic storage layer 231 is lower than the second Curie temperature $T_{C2}$ of the transition metal sub-lattice of the ferrimagnetic storage layer 231 and of the second storage magnetization 235.

At the read temperature $T_1$ of the magnetic tunnel junction 2 (see FIG. 10), the ferrimagnetic amorphous alloy can be provided such that the vectorial sum of the 4f and 3d storage magnetizations 2342, 2341 results in the first storage magnetization 234 having substantially the same magnitude than the second storage magnetization 235. Due to the magnetic coupling of the coupling layer 233, the first storage magnetization 234 is oriented substantially antiparallel to the second storage magnetization 235, resulting in the effective storage magnetization 236 being substantially null. In this configuration, switching the first and second storage magnetizations 234, 235, during a write operation, requires a high write magnetic field 42. In this configuration, however, substantially no dipolar coupling occurs between the storage layer 23 and the sense layer 21 and the sense magnetization 211 can be easily switched. Having the first and second storage magnetizations 234, 235 being substantially equal at the read temperature $T_1$ can be obtained, for example, by adjusting the thicknesses of the ferrimagnetic storage layer 231 and of the second storage magnetization 235.

Heating the magnetic tunnel junction 2 at the write temperature $T_2$ results in decreasing the 4f storage magnetizations 2342 while the 3d storage magnetizations 2341 remains substantially unchanged. The first storage magnetization 234 is thus decreased in comparison to the one at the read temperature $T_1$. Since at the write temperature $T_2$ the second storage magnetizations 235 remains also practically unchanged compared to the one at the read temperature $T_1$, the effective storage magnetization 236 is increased, further reducing the write magnetic field 42 required for switching the first and second storage magnetizations 234, 235.

The magnetic tunnel junction 2 can be further heated at the write temperature $T_3$ where the first storage magnetization 234 becomes substantially zero. In the example of FIG. 10, the write temperature $T_3$ corresponds substantially to a compensation temperature $T_{COMP}$ of the ferrimagnetic storage layer 231 wherein the 4f storage magnetization 2342 is substantially equal to the 3d storage magnetization 2341 oriented in the opposed direction. At the write temperature $T_3$ the second storage magnetization 235 is only slightly decreased in comparison with the one at the write temperature $T_2$ such that the effective storage magnetization 236 is thus further increased. The write magnetic field 42 required for switching the first and second storage magnetizations 234, 235 can thus be further reduced.

Heating the magnetic tunnel junction 2 at the write temperature $T_4$ corresponding substantially to the first Curie temperature $T_{C1}$ of the rare-earth sub-lattice of the ferrimagnetic storage layer 231 results in the 4f storage magnetization 2342 being substantially zero. At the write temperature $T_4$, the vectorial sum of the first and the second storage magnetization 235 is thus maximal. The write magnetic field 42 required for switching the first and second storage magnetizations 234, 235 is thus minimal.

REFERENCE NUMBERS 1 magnetic random access memory cell
2 magnetic tunnel junction
21 sense layer
211 sense magnetization
22 tunnel barrier layer
23 synthetic storage layer
231 first magnetic layer
232 second magnetic layer
233 coupling layer
234 first storage magnetization
2341 3d storage magnetization
2342 4f storage magnetization
235 second storage magnetization
236 effective storage magnetization
24 antiferromagnetic layer
31 heating current
4 field line
41 write current
42 write magnetic field
5 current line
$B_S$ switching field
$B_{SAT}$ saturation field
$B_{SF}$ spin-flop field
$T_1$ read temperature
$T_2$, $T_3$, $T_4$ write temperature
$T_{C1}$ first Curie temperature
$T_{C2}$ second Curie temperature r

The invention claimed is:
1. A random access memory (MRAM) element comprising a magnetic tunnel junction comprising: a storage layer; a sense layer; and a tunnel barrier layer included between the storage layer and the sense layer; the storage layer comprising:
   a first magnetic layer having a first storage magnetization;
   a second magnetic layer having a second storage magnetization; and
   a non-magnetic coupling layer separating the first and second magnetic layers such that the first storage magnetization is substantially antiparallel to the second storage magnetization; the first and second magnetic layers being arranged such that:
   at a read temperature the first storage magnetization is substantially equal to the second storage magnetization; and
   at a write temperature which is higher than the read temperature the second storage magnetization is larger than the first storage magnetization.
2. MRAM element according to claim 1, wherein
   the first magnetic layer comprises a first ferromagnetic layer having a first Curie temperature, and the second magnetic layer comprises a second ferromagnetic layer having a second Curie temperature which is higher than the first Curie temperature.

3. MRAM element according to claim 2, wherein the write temperature is comprised below the first and second Curie temperatures.

4. MRAM element according to claim 2, wherein the write temperature is comprised above the first Curie temperature and below the second Curie temperature.

5. MRAM element according to claim 1, wherein the first magnetic storage layer comprises a ferrimagnetic amorphous alloy comprising a sub-lattice of transition metals atoms providing a 3d storage magnetization, and a sub-lattice of rare-earth atoms providing a 4f storage magnetization being antiparallel to the 3d storage magnetization; and wherein the first storage magnetization corresponds to the vectorial sum of the 3d storage magnetization and the 4f storage magnetization.

6. MRAM element according to claim 5, wherein the rare-earth sub-lattice has a first Curie temperature and the transition metal atom sub-lattice has a second Curie temperature which is higher than the first Curie temperature.

7. MRAM element according to claim 6, wherein the write temperature corresponds substantially to a compensation temperature of the ferrimagnetic storage layer, where the first storage magnetization becomes substantially zero.

8. MRAM element according to claim 6, wherein the write temperature corresponds substantially to the first Curie temperature of the rare-earth sub-lattice of the ferrimagnetic storage layer.

9. A method for writing a MRAM element comprising a magnetic tunnel junction including a storage layer, a sense layer, and a tunnel barrier layer between the storage layer and the sense layer; the storage layer comprising a first magnetic layer having a first storage magnetization, a second magnetic layer having a second storage magnetization, and a non-magnetic coupling layer separating the first and second magnetic layers such that the first storage magnetization is substantially antiparallel to the second storage magnetization; the first and second magnetic layers being arranged such that at a read temperature the first storage magnetization is substantially equal to the second storage magnetization, and at a write temperature which is higher than the read temperature the second storage magnetization is larger than the first storage magnetization; the method comprising:

heating the magnetic tunnel junction at the write temperature;

adjusting the first and second storage magnetizations; and cooling the magnetic tunnel junction at the read temperature.

10. Method according to claim 9, wherein adjusting the first and second storage magnetizations is performed by applying a write magnetic field.

11. Method according to claim 9, wherein the MRAM element further comprises a current line in electrical contact with one end of the magnetic tunnel junction; and wherein heating the magnetic tunnel junction comprises passing a heating current in the magnetic tunnel junction via the current line.

* * * * *